United States Patent [19]

Imanaka et al.

[11] Patent Number: 4,954,480
[45] Date of Patent: Sep. 4, 1990

[54] MULTI-LAYER SUPERCONDUCTING CIRCUIT SUBSTRATE AND PROCESS FOR MANUFACTURING SAME

[75] Inventors: Yoshihiko Imanaka; Takato Machi, both of Atsugi; Kazunori Yamanaka; Hiromitsu Yokoyama, both of Sagamihara; Nobuo Kamehara, Isehara; Koichi Niwa, Tama, all of Japan

[73] Assignee: Fujitsu Limited, Kawasaki, Japan

[21] Appl. No.: 197,583

[22] Filed: Apr. 27, 1988

[30] Foreign Application Priority Data

Apr. 27, 1987 [JP] Japan .................. 62-105624

[51] Int. Cl.$^5$ .................... B32B 3/00
[52] U.S. Cl. .................. 505/1; 505/701; 505/702; 505/703; 505/704; 428/68; 428/76; 428/209; 428/210; 428/426; 428/432; 428/433; 428/688; 428/901; 428/930
[58] Field of Search ............ 505/1, 701.4; 29/599; 428/209, 210, 426, 432, 433, 688, 901, 930, 68, 76

[56] References Cited

U.S. PATENT DOCUMENTS

| 4,220,959 | 9/1980 | Kroger | 29/599 X |
| 4,224,630 | 9/1980 | Kroger | 29/599 X |
| 4,316,785 | 2/1982 | Suzuki et al. | 29/599 X |

FOREIGN PATENT DOCUMENTS

| 0040905 | 12/1981 | European Pat. Off. |
| 0098067 | 1/1984 | European Pat. Off. |
| 58-32797 | 7/1983 | Japan |

OTHER PUBLICATIONS

IBM Technical Disclosure Bulletin, vol. 27, No. 7B 12/84, p. 4254, Superconducting MLC Module for Josephson Devices by H. D. Kaiser & R. W. Nufer.
Physical Review Letter, vol. 58, No. 9, Mar. 2, 1987, High-Pressure Study of the New Y–Ba–Cu–O Superconducting Compound System, pp. 911 and 912.
IBM Technical Disclosure Bulletin, vol. 21, No. 10, Mar. 1979, pp. 4213, 4214, Connectors for Cryogenic Circuits, F. Fang and B. P. Piggin.
Copy of European Search Report.
A. W. Sleight et al., "High-Temperature Superconductivity in the $BaPb_{1-x}Bi_xO_3$ System", Solid State Communication, vol. 17, pp. 27–28, '75.
Truong, D. et al., "Superconductivity in the $BaPb_{1-x}Bi_xO_3$ System", Appl. Phys. 22, 205–212 (1980).
M. Suzuki et al., "Preparation of Superconducting $BaPb_{1-x}Bi_xO_3$ Thin Films by RF Sputtering", Shinku, vol. 24, No. 2 (1981).
L. F. Mattheiss et al., "Electronic Structure of $BaPb_{1-x}Bi_xO_3$", Physical Review B, vol. 28, No. 8, 4227.
C. W. Chu et al., "Evidence for Superconductivity Above 40K in the La–Ba–Cu–O Compound System", Physical Review Letters, vol. 58, No. 4, 405–407.
R. J. Cava et al., "Bulk Superconductivity at 36K in $La_{1.8}Sr_{0.2}CuO_4$", Physical Review Letters, vol. 58, No. 4, 408–410.
M. K. Wu et al., "Superconductivity at 93K in a New Mixed-Phase Y–Ba–Cu–O Compound System", Physical Review Letters, vol. 58, No. 9, 908–910.
P. H. Hor et al., "High-Pressure Study of the New Y–Ba–Cu–O Superconducting Compound System", Physical Review Letters, vol. 58, No. 9, 911–912.
J. D. Jorgensen et al., "Lattice Instability and High-$T_c$ Superconductivity in $La_{2-x}Ba_xCuO_4$", Physical Review Letters, vol. 58, No. 10, 1024–1027.
L. F. Mattheiss, "Electronic Band Properties and Superconductivity in $La_{2-y}X_yCuO_4$", Physical Review Letters, vol. 58, No. 10, 1028–1030.
Shin-ichi Uchida et al., "High $T_c$ Superconductivity of La–Ba–Cu Oxides", Japanese Journal of Applied Physics, vol. 26, No. 1, Jan. 1987, pp. L1–L2.
J. G. Bednorz et al., "Possible High $T_c$ Superconductivity in the Ba–La–Cu–O System", Z. Phys. B–Condensed Matter 64, 189–193 (1986).

*Primary Examiner*—Patrick Ryan
*Attorney, Agent, or Firm*—Staas & Halsey

[57] ABSTRACT

A multi-layer superconducting circuit substrate, including insulating layers, and interconnection patterns of a superconductive ceramic material located between the insulating layers, the patterns of the superconductive ceramic material being connected via through-holes of the superconductive ceramic material, is provided. The patterns of the superconductive ceramic material are preferably encapsulated with a metal of gold, silver, platinum or an alloy thereof.

4 Claims, 7 Drawing Sheets

MULTI-LAYER SUPERCONDUCTING CIRCUIT SUBSTRATE AND PROCESS FOR MANUFACTURING SAME

BACKGROUND OF THE INVENTION

The present invention relates to a multi-layer superconducting circuit substrate, particularly to a multi-layer superconducting circuit substrate suitable for use in a high speed computer such as a supercomputer, and a process for manufacturing same. A substrate used for high speed processing requires a conductive material having a low electrical resistance, in addition to an insulating material having a low dielectric constant, to ensure an efficient transmission of signals.

As a substrate for high speed processing, a multi-layer ceramic substrate is known in which a glass-ceramic material, i.e., a complex of a ceramic and a glass (dielectric constant $\epsilon \approx 5$), is used as an insulating material and copper (resistivity $\rho = 1.7$ $\Omega$.cm) is used as a conducting material (for example, see Yogyo Kyokai Annual Conference Digest, 1985, P. 533).

Japanese Unexamined Patent Publication (Kokai) No. 60-173885, published on Nov. 7, 1985, describes a superconductive oxide material of $BaBiO_{3-\delta}$ ($0 \leq \delta < 0.5$) wherein less than 50% by atom of Ba is replaced by Sr, Pb, Sc, Y or a Lanthanide element, the superconductive oxide material having a superconducting transition temperature of about 12 K.; and a process for manufacturing a superconductive oxide material of $BaBiO_{3-\delta}$ ($0 \leq \delta < 0.5$); the process including the steps of uniformly mixing a Ba compound and a Bi compound, calcining the mixture in an oxidizing atmosphere at a temperature of more than 600° C., pulverizing the calcined product, pressing the resultant powder to form a body, and annealing the body in an atmosphere containing more than 10 kg/cm$^2$ of oxygen at 700° C. to compensate for a large amount of oxygen lost in the calcining step.

Also known are the following oxide superconductive materials:

(1) La-Ba-Cu-O system:
Bednorz: Z. Phys. B. 64, 189, 1986;
Uchida: J. J. A. P. vol. 26, No. 1, L1, 1987;
Chu: Physical Review Letters; vol. 58, No. 4, 405, 1987;
Jorgensen: Physical Review Letters; vol. 58, No. 10, 1024, 1987;

(2) La-Sr-Cu-O system:
Cava: Physical Review Letters: vol. 58, No. 4, 408, 1987;
Mattheiss: Physical Review Letters; vol. 58, No. 10, 1028, 1987; and (3) Y-Ba-Cu-O system:
Hor: Physical Review Letters; vol 58, No. 9, 911, 1987; and
Wu: Physical Review Letters; vol. 58, No. 9, 908, 1987.

Specifically:
(1) the La-Ba-Cu-O system includes

| | |
|---|---|
| $La_4BaCu_5O_{5(3-y)}$ <br> $La_{4.25}Ba_{0.75}Cu_5O_{5(3-y)}$ | $T_{cf}$ 13K, $T_{co}$ 35K; |
| $La_{0.8}Ba_{0.2}CuO_{(3-y)}$ <br> $La_{0.85}Ba_{0.15}CuO_{(3-y)}$ | $T_{cf}$ 4K; |
| $(La_{0.8}Ba_{0.2})_2CuO_{(4-y)}$ | |
| $(La_{0.85}Ba_{0.15})_2CuO_{(4-y)}$ | $T_{cf}$ 20K, $T_{co}$ 36K; |
| $La_{1.85}Ba_{0.15}CuO_4$ <br> $La_{1.90}Ba_{0.10}CuO_4$ | $T_{cf}$ 20K, $T_{co}$ 35K; |

(2) the La-Sr-Cu-O system includes

| | |
|---|---|
| $La_{1.9}Sr_{0.1}CuO_4$ | |
| $La_{1.8}Sr_{0.2}CuO_4$: | $T_{cf}$ 28.5K, $T_{cm}$ 33.1K, $T_{co}$ 36.5K; |
| $La_{1.7}Sr_{0.3}CuO_4$: | $T_{cm}$ 15K, $T_{co}$ 35K; |
| $La_{1.925}Sr_{0.075}CuO_4$: | $T_{cf}$ 26.5K, $T_{cm}$ 34K, $T_{co}$ 52K, |
| $La_{1.85}Sr_{0.15}CuO_4$: | $T_{cf}$ 36K, $t_{cm}$ 37.5K, $T_{co}$ 40K; |

(3) the Y-Ba-Cu-O system includes

| | |
|---|---|
| $(Y_{0.6}Ba_{0.4})_2CuO_{4+\delta}$: | $T_{cf}$ 88.5K, >77K, $T_{co} \geq$ 100K; |
| Y-Ba-Cu-O <br> (by Keiichi Ogawa) | $T_c$ 77K, $T_{co}$ 100K; |
| Y-Ba-Cu-O: <br> (by Molecular Institute and Tohoku University) | $T_c$ 95K; |
| $Y_{0.4}Ba_{0.6}CuO_3$: <br> (by Kazumasa Togano) | $T_c$ 93, $T_{co}$ 123K. |

At present, the conducting materials used in substrates have an electrical resistance which inhibits the design of even longer or finer interconnection patterns. A demand therefore exists for a substrate for high speed processing, the substrate using a conductivity material having an even lower electrical resistance, which substrate is to be used in a future generation computer. Although a superconductive oxide material meets this requirement, i.e., a lower electrical resistance, it is difficult to form a superconductive oxide material into an interconnection pattern. New interconnection patterns should have definite peripheries which are at least as definite as those of the copper patterns, in order to reduce interactions between neighboring patterns, since the density of the patterns will be made higher.

SUMMARY OF THE INVENTION

The object of the present invention is to provide a multi-layer substrate including a conducting pattern having a lower electrical resistance and a definite periphery.

This and other objects of the present invention are attained by a multi-layer substrate including a plurality of insulating layers laminated into a multilayer structure; the insulating layers having holes penetrating therethrough; interconnection layers of a superconductive ceramic material between the insulating layers; and through-holes of a superconductive ceramic material filling the holes of the insulating layer and electrically connecting the interconnetion layers.

That is, the copper interconnection patterns in a multi-layer substrate of the prior art are replaced with interconnection patterns of a superconductive ceramic material, such as an oxide superconductive material including Y-Ba-Cu-O, La-Sr-Cu-O, and Sc-Ba-Cu-O systems, which exhibit superconductivity at a temperature above the boiling point of nitrogen, i.e., 77 K.

Typically, the ceramic superconductive material used in the present invention is an oxide ceramic material represented by the general formula $X_aY_{1-a}ZO_b$ or $(X_{1-a}Y_a)_2ZO_b$ where $0 < a < 1$; $3 \leq b < 4$; X is at least one element selected from the group of Ba, Ca, Sr, and Mg;

Y is at least one element selected from the group of Sc, Y, La, Ce, Pr, Nd, Pm, Sm, Eu, Gd, Tb, Dy, Ho, Er, Tm, Yb, and Lu; and Z is at least one element selected from the group of Cu, Ag, and Au.

X, Y, and Z in the above formula may be more than one element. For example, X may be Ba-Ca-Sr, Ba-Ca-Mg, Ba-Ca, or Ca-Mg; Y may be Sc-Y, Sc-Y-La, Sc-Y-La-Ce, or Pr-Nd; and, Z may be Cu-Ag, Cu-Au, Ag-Au, or Cu-Ag-Au.

Thus, the oxide superconductive material may be, for example, $(Ba_{0.6}Ca_{0.2}Sr_{0.2})_{0.6}(Sc_{0.7}Y_{0.2}La_{0.1})_{0.4}(Cu_{0.8}Ag_{0.2})_3O_{4-\delta}$ or $(Ba_{0.8}Mg_{0.2})_{0.7}(Sc_{0.6}Nd_{0.4})_{0.3}Cu_3O_{4-\delta}$.

A preferred oxide superconductive material is $\{(M^{II}O)_x(M_2^{III}O_3)_{1-x}\}_y(CuO)_z(O)_\delta$ wherein $M^{II}$ stands for at least one of Ba, Sr, Ca, and Mg; $M^{III}$ stands for at least one of Y, Sc, La, Ce, Pr, Nd, Sm, Eu, Gd, Tb, Dy, Ho, Er, Tm, Tb, and Lu; $0.5 \leq x \leq 0.9$; $1 \leq y \leq 2$; $1 \leq z \leq 2$; and $\delta$ stands for a deviation of the amount of oxygen from the stoichiometry; the oxide superconducting material exhibiting superconductivity above the boiling point of nitrogen (77 K.).

Another example of a superconducting ceramic material is a bismuth-system (Bi-Sr-Ca-Cu-O system) superconducting ceramic material. The exact chemical formula of the bismuth-system superconducting ceramic material is not known but can be formed from a starting material of a mixture of Bi, Sr, Ca, and Cu compounds in a molar ratio (based on these elements) of 0.25-2:0-.1-5 0.1-5:0.5-4. For example, 1:1:1:2; 1:1:1:3, 4:3:3:6; and 4:3:3:4. Further, another superconducting ceramic material can be formed from a starting material of a mixture of Tl, Bi, Sr, Ca, and Cu compounds in a molar ratio (based on these elements) of 0.25-2:0.25-2:0.1-5:0-.1-5:0.5-4. These superconducting ceramic materials exhibit superconductivity above the boiling point of nitrogen (77 K.).

In a preferred embodiment, the interconnection layer of a superconductive ceramic material is encapsulated by a metal selected from the group of gold, silver, platinum or an alloy thereof, to prevent a reaction of the superconductive ceramic material with the insulating material of the insulating layers sandwiching the superconductive ceramic material during firing of the green sheets of the insulating material or annealing of the ceramic superconductive material. Ingredients of a superconductive ceramic material diffuse into the insulating material during firing or annealing. The reaction between the superconductive ceramic material and the insulating material or diffusion of ingredients of a superconductive ceramic material into the insulating material causes a deterioration of the superconductive property of the superconductive ceramic material. The metal encapsulating the superconductive ceramic layer should be a noble metal such as gold, silver, platinum or an alloy thereof, since it must withstand firing or annealing in an oxygen-containing atmosphere at about 1000° C. An oxygen-containing atmosphere and a temperature of about 1000° C. are necessary to preserve or recover the superconductive property of a superconductive ceramic material. The metal may supplement the electrical conductivity of the ceramic superconductive pattern.

The insulating material of the insulating layer of the multi-layer substrate is preferably a glass/ceramic composite which can be sintered from a green sheet thereof at a temperature lower than a temperature used when annealing a superconductive ceramic material. If the temperature for sintering the insulating material from a green sheet thereof is too high, the superconductive property of the superconductive ceramic material is degraded during the firing of the green sheet of the insulating material. An example of such a glass/ceramic composite, i.e., a composite of a ceramic and glass, is a composition containing 20 to 50% by wright of alumina, 10 to 60% by weight of quartz glass, and 20 to 40% by weight of glass or crystallized glass, which can be sintered at a temperature lower than the temperature of firing the paste for the superconducting ceramic material, typically lower than 1000° C., preferably lower than 900° C.

In another aspect of the present invention, there is provided a process for manufacturing a multi-layer substrate, comprising the steps of: preparing green sheets of an insulating material; forming an interconnection pattern of a superconductive ceramic material on each of the green sheets; forming through-holes of a superconductive ceramic material penetrating through the green sheets; laminating and pressing the green sheets having the interconnection patterns and the through-holes; and firing the laminate, whereby a multi-layer substrate including layers of the insulating material, the interconnection patterns of the superconductive ceramic material, and the through-holes of the superconductive ceramic material is formed.

In a preferred embodiment of the present invention, there is provided a process for manufacturing a multi-layer substrate including the steps of: preparing green sheets of an insulating material, the green sheets having first and second main surfaces and the holes penetrating through the green sheets; forming a pattern of a metal paste on the first and second main surfaces of each of the green sheets, the metal paste pattern covering the inner surfaces of the penetrating holes of the green sheets; the metal of the metal paste pattern being selected from the group consisting of the gold, silver, platinum and an alloy thereof; forming an interconnection pattern of a superconductive ceramic material paste on and within the metal paste pattern, the superconductive ceramic material paste filling the penetrating holes; laminating the green sheets having the patterns of the metal paste and the superconductive ceramic material paste, whereby the interconnection patterns of the superconductive ceramic material paste are encapsulated with the metal paste patterns and isolated from the green sheets; and firing the laminate, whereby a multi-layer substrate including insulating layers and the interconnection patterns of a superconductive ceramic material which is encapsulated by the metal is obtained.

In a further aspect of the present invention, there is provided a paste for forming a superconducting ceramic film by printing and firing, the paste including a powder of a superconducting ceramic material or powders of ingredients which form a superconducting ceramic material by firing; an organic binder; and non-volatile solvent. Typically, the paste includes 100 parts by weight of the above inorganic powder or powders, 0.5 to 10 parts by weight of the organic binder; and 5 to 10 parts by weight of the non-volatile solvent.

DETAILED DESCRIPTION OF THE PREFERRED EMBODIMENTS

EXAMPLE 1

A first embodiment of the present invention is described with reference to the flow chart in FIG. 1 and a sectional view of a multi-layer substrate in FIGS. 2a and 2b.

A paste of a superconductive ceramic material was prepared by blending powders of $BaCO_3$, $Y_2O_3$, and CuO at a molar ratio of 0.6:0.2:1, and mixing the powders in a ball mill for 20 hours to homogenize the mixture. The mixture was pressed at 200 MPa to form pellets having a diameter of 30 mm. The formed pellets were then heat treated in air at 900° C. for 6 hours and pulverized to form powders of $Ba_{0.6}Y_{0.4}CuO_{4-\delta}$. To these powders of $Ba_{0.6}Y_{0.4}CuO_{4-\delta}$ were added a binder (e.g., ethylcellulose), terpineol and methylethylketone, which were then kneaded in a paste mixer for about 10 minutes, and passed 30 times through a roll mill as a second kneading process. The resultant paste has a viscosity of about 2000 poise.

The superconductive ceramic material may be the Y-Ba-Cu-O system, Sc-Ba-Cu-O system, or La-Sr(Ba)-Cu-O system compound, mentioned before. Preferably, the superconductive ceramic material is a superconductive ceramic material of the Y-Ba-Cu-O system, for example, $YBa_2Cu_3O_{7-\delta}$, $Y_{0.4}Ba_{0.6}CuO_3$ or $(Y_{0.6}Ba_{0.4})_2CuO_{4-\delta}$, which exhibits a superconductivity at a temperature above the boiling point of nitrogen. The binder may be any organic binder, but ethylcellulose, polyvinylbutylalcohol, methylcellulose, acrylic acid-based polymer, etc. are preferred.

A green sheet of a glass-ceramic material was prepared as follows: Powders of alumina and glass having an average particle size of about 3 μm, a binder, and a solvent were blended and kneaded in a ball mill for 30 hours. The resultant slurry was tape-cast by the doctor blade method to form a green sheet having a dry thickness of about 300 μm. The thickness of a green sheet of a glass-ceramic material is preferably in a range of 100 to 500 μm, more preferably 200 to 300. The green sheet was cut into a square 150 mm × 150 mm, and the cut green sheet is perforated to form holes to be used as through-holes.

A composition for a green sheet or an insulating material may have the following compositions, as described in Japanese Unexamined Patent Publication (Kokai) No. 59-995, published on June 6, 1984:

| Composition of glass ceramic powders (wt %) | |
|---|---|
| $Al_2O_3$ | 50.5 |
| $SiO_2$ | 35.0 |
| $B_2O_3$ | 13.0 |
| $Na_2O$ | 0.75 |
| $K_2O$ | 0.70 |
| CaO | 0.15 |
| $Li_2O$ | 0.15 |
| Composition of glass ceramic slurry (wt %) | |
| glass ceramic powders | 57.8 |
| polymethylacrylate resin | 8.7 |
| dibutylphthalate (plasticizer) | 4.6 |
| methylethylketone (solvent) | 16.1 |
| methylalcohol (solvent) | 8.7 |
| butylalcohol (solvent) | 2.9 |

From the slurry having the above compositions, a green sheet having a uniform thickness of, e.g., 0.3 mm, may be formed by the doctor blade method. Alternatively, the slurry may be used as a paste for printing.

Also, a glass ceramic composition of a mixture of 20 to 50% by weight of alumina, 10 to 60% by weight of quartz glass, and 20 to 40% by weight of glass or crystallized glass, which can be fired at a temperature lower than the temperature for firing the superconducting ceramic material, typically lower than 1000° C., may be used. (Japanese Unexamined patent publication (Kokai) No. 60-254697, published on Dec. 16, 1985). An example of this composition has the following glass ceramic powder and slurry compositions:

| Composition of glass ceramic powder (wt %) | |
|---|---|
| $Al_2O_3$ | 34.2 |
| $SiO_2$ | 59.3 |
| $B_2O_3$ | 4.9 |
| $Na_2O$ | 1.3 |
| $K_2O$ | 0.2 |
| CaO | 0.1 |
| Composition of glass ceramic slurry (wt %) | |
| alumina | 19.8 |
| quartz glass | 19.8 |
| borosilicate glass | 19.8 |
| polymethacrylate ester-system resin | 5.9 |
| dibutylphthalate (plasticizer) | 2.2 |
| methylethylketone | 32.5 |

This slurry can be cast to form a green sheet by the doctor blade method or used as an insulating paste for printing.

Onto the resultant green sheet, an interconnection pattern of the ceramic superconducting material paste was printed to a thickness of about 20 μm. The paste of a ceramic superconductive material may be replaced by a paste of powders of $BaCO_3$, $Y_2O_3$, and CuO, at a mole ratio of 0.6:0.2:1 with a binder, terpineol and methylethylketone. The thickness of the interconnection pattern of the ceramic superconductive material is preferably in a range of more than 20 μm, more preferably 20 μm to 40 μm. The paste of the ceramic superconductive material was also filled in the holes of the green sheets to form through-holes by the same printing step or by a separate step.

Thirty sheets of the dried printed green sheets were laminated and pressed at a pressure of 30 MPa. The laminate was then fired in air at 1000° C. for 5 hours to form a multi-layer substrate composed of consolidated glass-ceramic insulating layers and ceramic superconductive layers. The firing atmosphere may be oxygen or an atmosphere containing a lower partial pressure of oxygen than air. Then, the obtained multi-layer substrate is annealed in oxygen at 900° C. for 30 minutes FIG. 2A illustrates the obtained multi-layer substrate 1 in which a plurality of glass-ceramic insulating layers 2 were laminated, superconductive ceramic layers or patterns 3 inserted between the insulating layers 2, and through holes 4 formed to interconnect adjacent ceramic superconductive layers or patterns 3. As seen in FIG. 2A, an additional insulating layer 5 may be inserted between the insulating layers 2 where the superconductive ceramic patterns do not exist, by screen printing, if necessary.

Figure 3:
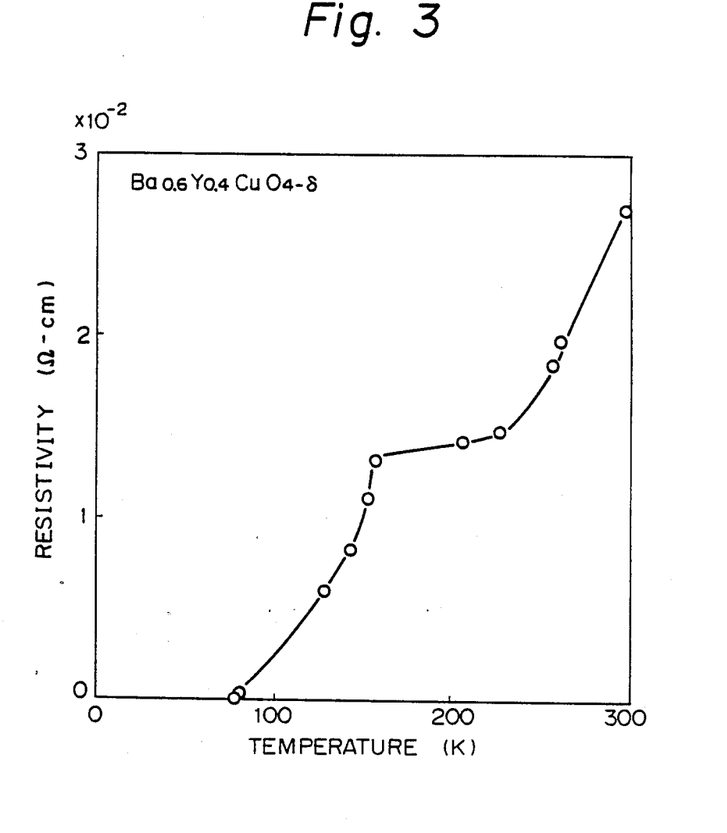
FIG. 3 is a graph of the electrical resistivity of the superconductive ceramic material patterns of a multi-layer substrate of Example 1.

The electrical resistivity of this multi-layer substrate was measured by the four probe method. The results are shown in FIG. 3. The electrical resistivity became zero at 77 K. of the temperature of liquid nitrogen.

A multi-layer substrate similar to the above may be formed on a hard or sintered ceramic base such as an alumina plate. FIG. 2B illustrates such a multi-layer substrate. Paste layers of a superconductive ceramic material 3 and an insulating material 2 were successively and repeatedly formed on an alumina plate 6 by a printing process such as screen printing, and then fired, and thus a multi-layer substrate having an alumina plate as a base was manufactured by a thick film forming method.

EXAMPLE 2

Figure 4:
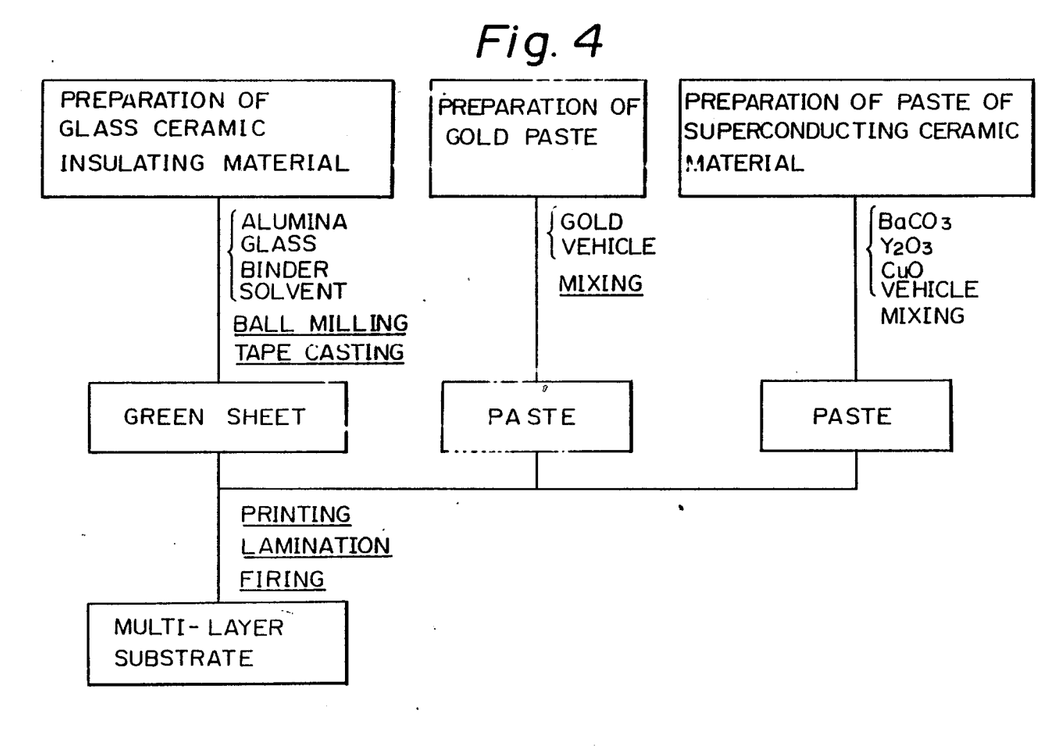
FIG. 4 is a flow chart of the manufacturing process of a multi-layer substrate of Example 2.
Figure 5:
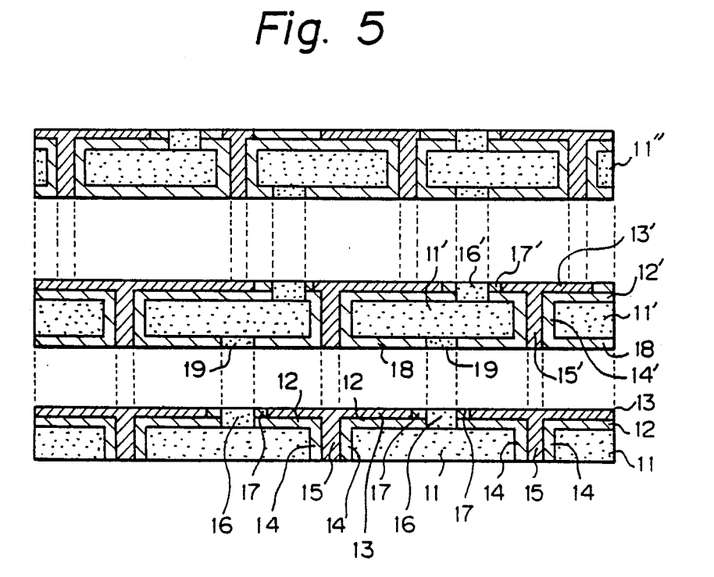
FIG. 5 is a sectional view of green sheets before lamination in Example 2.
Figure 6:
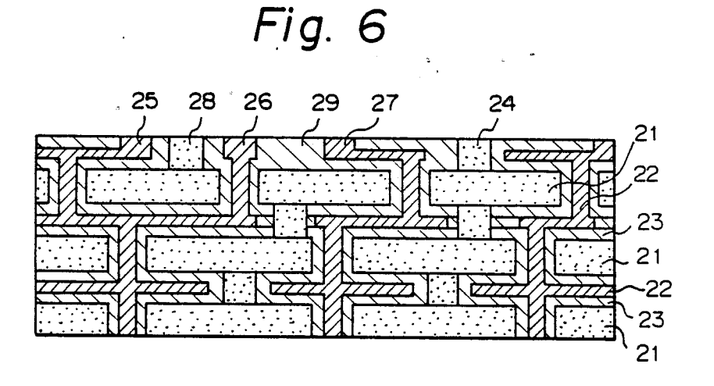
FIG. 6 is a sectional view of a multi-layer substrate of Example 2.

The following description is made with reference to FIGS. 4 to 6.

A paste of a superconductive ceramic material was prepared in accordance with the procedure of Example 1.

A gold paste was prepared by blending a gold powder having an average particle size of about 1 $\mu$m, a binder, terpineol, and methylethylketone, and kneading the blend in a paste mixer for about 10 hours, during which time the methyethylketone was completely evaporated. The kneaded blend was passed 30 times through a roll mill as a second kneading process, to obtain a gold paste having a viscosity of about 2000 poise. If the resultant gold paste has a viscosity higher than 2000 poise, a small amount of terpineol can be added to bring the viscosity to about 2000 poise.

The preparation of green sheets of a glass ceramic material was similar to that of Example 1. After square green sheets having a size of 150 mm $\times$ 150 mm and perforated with holes for through-holes were prepared, a first pattern 12 of the gold paste was printed on an upper surface of a first green sheet 11. The gold paste preferably has a dry thickness in a range of less than about 10 $\mu$m, more preferably from 5 to 10 $\mu$m. The first pattern 12 corresponds to a first interconnection pattern 13 of a superconductive ceramic material and has a pattern width larger than the width of the first interconnection pattern 13 of the superconductive ceramic material. For example, the first pattern 12 of the gold paste had a width of 100 to 200 $\mu$m. In the printing of the gold paste, the gold paste was made to flow into the holes of the first green sheet 11 and cover the inner surfaces of the holes to form a gold layer 14. This flow of gold paste into the holes was effected by adjusting the viscosity of the gold paste. However, covering the inner surfaces of the holes with a gold paste may be effected by a process separate from the printing of the first pattern 12 of the gold paste onto the upper surface of the green sheet 11, if necessary. The first pattern 12 of the gold paste and the gold layer 14 were then dried at 80° C. for 10 minutes.

Subsequently, the first interconnection layer or pattern 13 of the paste of the superconductive ceramic material was formed on and within the first pattern 12 of the gold paste. This pattern 13 preferably has a thickness of more than about 20 $\mu$m, more preferably 20 to 40 $\mu$m, and a width narrower than that of the first gold paste pattern 12, generally 50 to 150 $\mu$m, for example, 100 $\mu$m. The paste of the superconductive ceramic material was also filled in the holes of the green sheet 11 to form through-holes 15.

Preferably, a paste of an insulating material that is the same as the material of the green sheet 11 is printed on the first green sheet 11 where the first pattern 12 of the gold paste is not formed. The resultant insulating material paste pattern is denoted by reference numeral 16 in FIG. 5. Also preferably, an additional gold paste pattern is printed on the first gold pattern 12 along the peripheries thereof to isolate the superconductive ceramic material paste pattern 13 from the insulating material paste pattern 16. This additional gold paste pattern is denoted by reference numeral 17 in FIG. 5. These paste patterns 16 and 17 are preferable, in that they level off the top surface of the printed green sheet 11, but need not be included.

Referring now to the second green sheet 11', second gold paste patterns 12' and 14', a second superconductive material interconnection pattern 13', through holes 15' of the superconductive ceramic material paste, a complemental insulating paste pattern 16', and an additional gold paste pattern 17' were formed on the upper surface and in the holes of the second green sheet 11', in accordance with the same procedures as for the first green sheet 11. However, another pattern 18 of gold paste was printed on the lower surface of the second green sheet 11' before the superconductive, ceramic material paste was filled into the hole 15'. The pattern of the gold paste pattern 18 corresponded to the first gold paste pattern 12 so that, when the second green sheet 11' was superposed on the first green sheet 11, the gold paste patterns 12 and 18, and if included, the gold paste pattern 17, encapsulated the first interconnection pattern 13 of the superconductive ceramic material paste. A complementary pattern 19 of the insulating material paste can be preferably printed on the lower surface of the second green sheet 11', to level off the surface thereof.

In accordance with the same procedures as for the second green sheet 11', a total of 30 green sheets including the first green sheet 11 were provided with necessary patterns of gold paste, the superconductive ceramic material paste, and the insulating material paste.

These 30 green sheets were laminated and pressed at a pressure of 30 MPa. FIG. 6 is a sectional view of the resultant laminate, in which reference numeral 21 denotes the insulating green sheets, 22 denotes the superconductive ceramic material patterns or layers, 23 denotes the gold paste patterns or layers, and 24 denotes the insulating material patterns or layers. In FIG. 6, patterns 25 and 26 of the superconductive ceramic material paste are separated by a pattern 28 of the insulating material paste, while the patterns 26 and 27 of the superconductive ceramic material paste are connected through the pattern 29 of the gold paste, and are not connected by the superconductive ceramic material paste itself. The latter structure may be changed if desired.

The laminate as in FIG. 6 was then fired in air at 1000° C. for 5 hours to form a multi-layer substrate in which the insulating material sheets, gold layers, and superconductive ceramic material layers are made into a monolith. The laminate is then annealed in oxygen at 900° C. for 30 minutes. The firing conditions should be such that the insulating material (a glass/ceramic material in this example) is sintered and the superconductive ceramic material pattern becomes superconductive as a current passes. Generally, the superconducting ceramic material of the $X_aY_{1-a}ZO_b$ or $(X_{1-a}Y_a)_2ZO_b$ formulae requires firing in an atmosphere containing oxygen such as in air or in oxygen at about 850° to 1000° C., typically 950° C. for 1 to 30 hours, typically 5 to 12 hours. After firing, it is preferable to conduct annealing in oxygen at 800° to 900° C. for 10 to 120 minutes, typically 30 minutes. The superconducting ceramic material of the bismuth-system such as $BiSrCaCu_2O_x$ requires firing in an atmosphere containing oxygen, usually in air at 850° to 900° C., typically 870° to 880° C. for 1 to 30 hours, typically 12 hours. If the temperature of the firing and annealing of the superconductive ceramic material is too high, the superconductivity of the material is degraded or even lost. Therefore, the insulating material of the green sheet must be able to be fired at a temperature lower than the firing or annealing temperature of the superconductive ceramic material; i.e., a glass ceramic material which can be fired or sintered at a relatively low temperature is preferable. The atmosphere in which the laminate is fired may be air or, an atmosphere containing oxygen in an amount of at least 5% oxygen.

Figure 1:
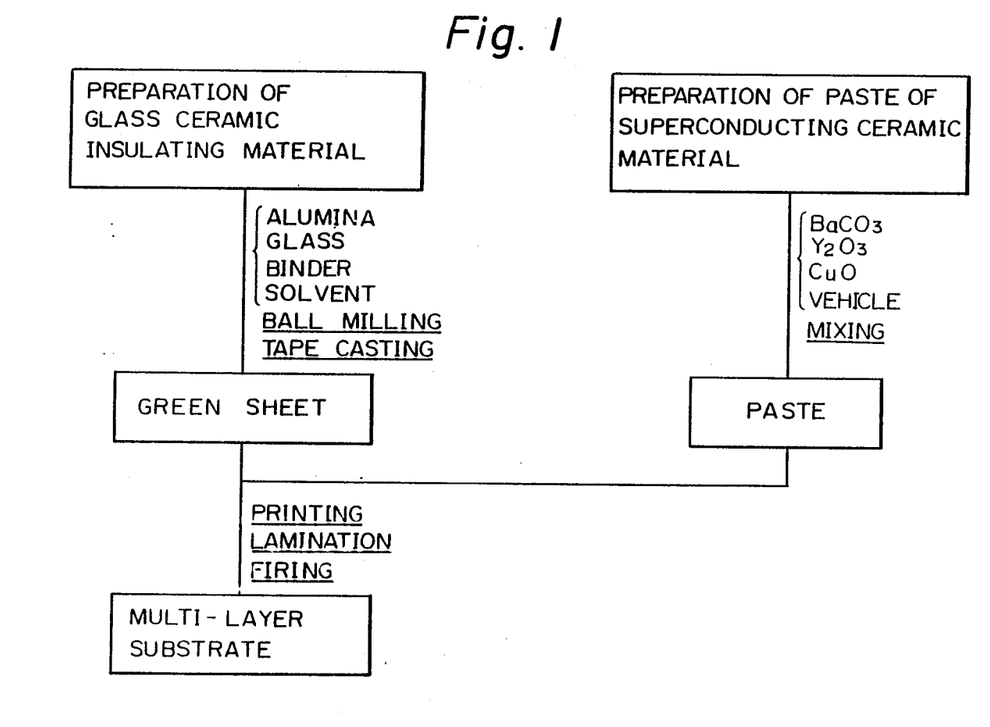
FIG. 1 is a flow chart of the manufacturing process of a multi-layer substrate of Example 1.
Figure 2A:
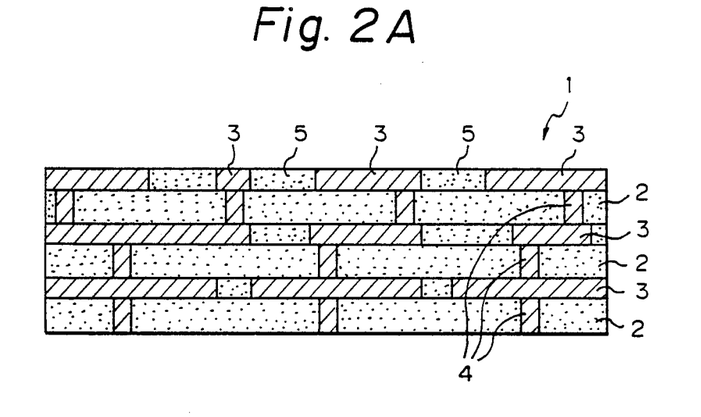
FIGS. 2A and 2B are sectional views of a multi-layer substrate of Example 1.
Figure 2B:
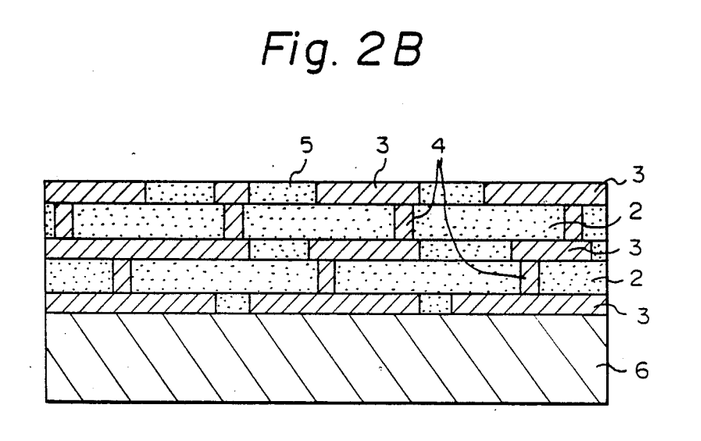

The electrical resistivity of the obtained multi-layer substrate was measured by the four probe method, and showed result similar to Example 1 and FIG. 1, including a zero resistivity at the temperature of liquid nitrogen (77 K.).

The gold may be replaced by other noble metals such as silver, platinum or an alloy thereof, since these metals are inactive in an oxygen-containing atmosphere at a temperature of about 1000° C. and act as a barrier layer for preventing a diffusion of ingredients of the superconductive ceramic material into the insulating material or the glass ceramic material. Copper, for example, is oxidized in an oxygen-containing atmosphere at about 1000° C., to form a copper oxide which does not prevent a diffusion of the ingredients of the superconductive ceramic material therethrough. Superconductive ceramic materials are sensitive to glass ceramic materials. If the ingredients of the superconductive ceramic material diffuse into a glass ceramic material, the superconductive ceramic material is degraded and the superconductivity thereof may be lost. Therefore, it is preferable to encapsulate the patterns of the superconductive ceramic material with a noble metal such as gold, silver, platinum or an alloy thereof, in a multi-layer substrate.

The metal encapsulating the superconductive ceramic pattern may act as a supplemental or complemental conducting pattern, because metals such as gold, etc., have a high electrical conductivity. When a supplemental or complemental conducting pattern only is desired, and encapsulation of the superconductive ceramic material is not necessary, the metal layer or pattern may be formed so that it is in contact with only one side of the superconductive ceramic material layer or pattern; i.e., it is not necessary to encapsulate the superconductive ceramic material pattern.

Returning to FIG. 5, the gold paste pattern 18 may not be formed on the second surface of the green sheet 11' or 11" and may be formed over the first interconnection pattern 13 of the superconductive ceramic material of the first green sheet 11. In this case, the insulating material pattern 19 can be a part of the insulating material pattern 16, and need not be printed separately therefrom. Accordingly, all of the printed layers may be formed on one side of a green sheet, and lamination of the green sheets and firing of the laminate may be carried out as described before.

Figure 7:
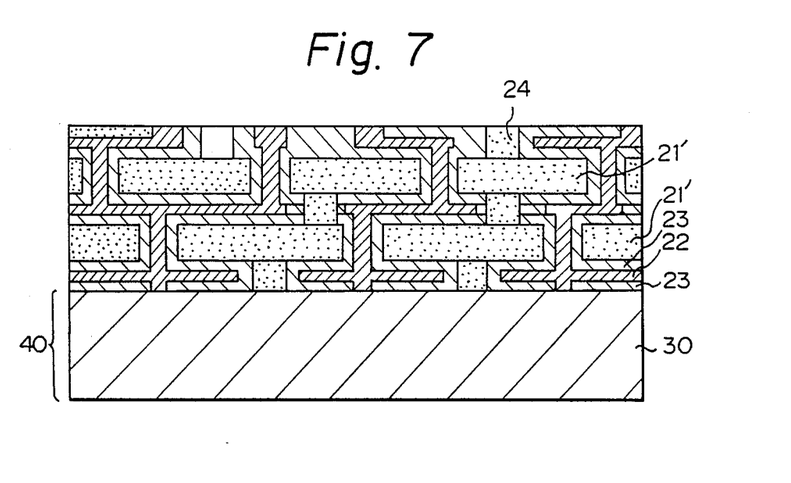
FIG. 7 is a sectional view of another multi-layer substrate of Example 2.

The multi-layer substrate as described above may be formed on a hard or sintered ceramic base such as an alumina plate 30, as seen in FIG. 7. In this case, not only the patterns of the gold 23, the superconductive ceramic material 22, and the insulating material 24, but also the insulating layers 21' instead of the green sheets 21, are formed by a thick film forming method such as screen printing. A thickness of the insulating material layers 21' is generally more than 80 μm, preferably from 100 to 150 μm, for example, 120 μm.

EXAMPLE 3

Example 2 was repeated except that, in the preparation of the superconductive ceramic material paste, the powder of CuO was replaced with a metal powder of copper and the superconductive ceramic material was formed at the stage of firing the laminate of the green sheets.

Powders of $BaCO_3$, $Y_2O_3$, and Cu at a molar ratio of 0.6:0.2:1 were mixed with a binder, terpineol, and methylethylketone and kneaded in a paste mixer for 10 hours, followed by passing the mass 30 times through a roll mill. Thus, a paste having a viscosity of about 2000 poise was obtained.

This paste was used to form patterns of a superconductive ceramic material The procedures for forming a laminate of the green sheets were the same as in Example 2.

The firing of the laminate was conducted in air, oxygen, or a mixture of oxygen and an inactive gas, at about 950° C. for 12 hours. The annealing of the laminate was conducted in oxygen at 850° C. for 60 minutes. After firing, a multi-layer substrate is obtained and the electrical resistivity of the superconducting ceramic material patterns of the multi-layer substrate was measured by the four probe method, which showed a result similar to FIG. 1, including a zero resistivity at 77 K. of liquid nitrogen.

EXAMPLE 4

Example 1 was repeated, except that the through holes were formed by causing balls of a superconductive ceramic material to penetrate the green sheets.

Figure 8:
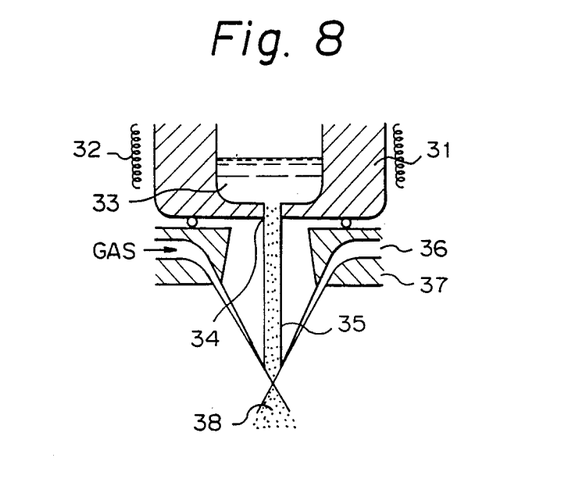
FIG. 8 is a schematic view of a process of atomizing a superconductive ceramic material.

The balls of a superconductive ceramic material were prepared as shown below For example, referring to FIG. 8, $BaCO_3$, $Y_2O_3$, and CuO were mixed at a molar ratio of 0.6:0.2:1 and fused in a crucible 31 heated by a heater 32. The fused ceramic material 33 was dropped through a nozzle 34. A high pressure gas 36 was applied to the dropping stream of the fused ceramic material 35 through a spraying nozzle 37, and thus the fused ceramic material was atomized and cooled to form powders of the ceramic material 38. The carrier gas for the high pressure gas 36 was, for example, $N_2$, Ar or air, and the pressure of the gas was about 3 to 5 kg/cm². Accordingly, spherical balls of a superconductive ceramic material having a particle size of 20 to 500 μm were obtained by this atomizing process.

Figure 9:
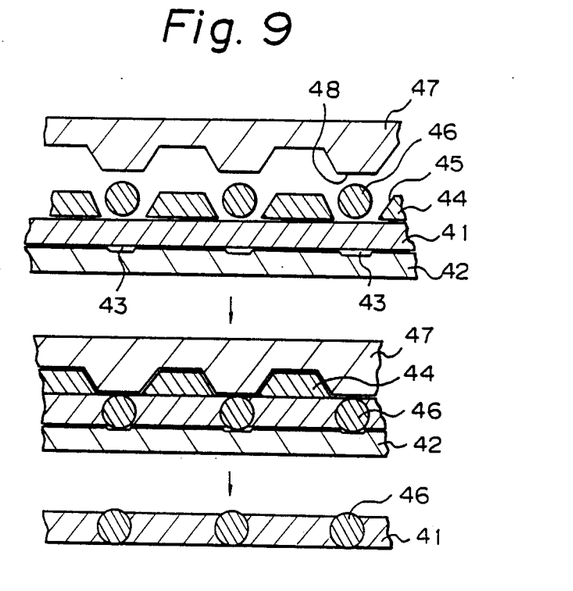
FIG. 9 illustrates the main steps of forming through-holes in a green sheet by causing balls to penetrate the green sheet of Example 4.

The penetration of the balls of the superconductive ceramic material was conducted as shown below. A green sheet 41 of a ceramic material was placed on a plate 42 having recesses 43 where the through holes were to be formed. Another plate 44 having tapered holes 45 where through holes were to be formed was placed on the green sheet 41, the tapered holes 45 being located just above the recesses 43 of the underlying plate 42. Balls 46 of a superconductive ceramic material were inserted in the tapered holes 45. A punching board 47 having protrusions 48 was set above another plate 44 having the holes, in such a manner that the protrusions 48 corresponded to the holes 45. The assembly of the underlying plate 42, the green sheet 41, the another plate 44 and the punching board 47 was then heat pressed and thus the balls 46 were made to penetrate the green sheet 41, whereby a green sheet 41 in which the through holes were formed by the balls 46 of the superconductive ceramic material was obtained. This process is described in Japanese Examined Patent Publication (Kokoku) No. 58-32797, which description is included herewith by reference.

By this ball penetration method, a precise perforation and filling of the holes can be carried out in one step.

The balls of a superconductive ceramic material may be balls of an unfired superconductive ceramic material. For example, a paste of a superconductive ceramic material as described in Example 1 can be formed by a mold into spherical balls, in which a heat curing resin was used as a binder for the paste.

EXAMPLE 5

Advantageously, a coupling agent such as a titanium or silicon coupling agent was included in the metal encapsulating the superconducting ceramic material pattern, to improve the adhesion of the metal with the green sheet, particularly the green sheet of a glass ceramic material, as well as with the superconducting ceramic material pattern, in a multi-layer substrate as shown in Example 2.

EXAMPLE 6

Figure 10:
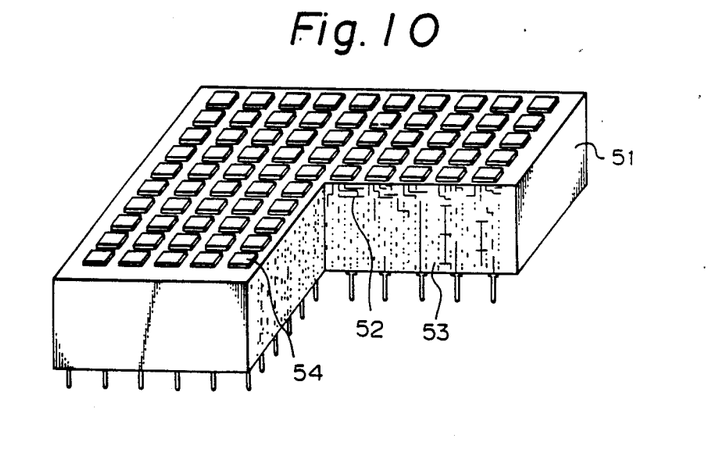
FIG. 10 is a perspective view of an electrical device in which chips are mounted onto a multi-layer substrate.

A multi-layer substrate as in the above Examples was manufactured, and IC's, LSI's, VLSI's, Josephson elements, etc., were mounted on the multi-layer substrate, as shown in FIG. 10, wherein reference numeral 51 denotes the multi-layer substrate, 52 denotes superconductive ceramic material patterns, 53 insulating layers, and 54 chips or elements such as IC's, etc.

We claim:

1. A multi-layer substrate, comprising:
   a plurality of insulating layers laminated into a multi-layer structure, the insulating layers being fired and having holes penetrated therethrough;
   interconnection layers of an oxide superconductive ceramic material located between the insulating layers, said superconductive, interconnection layers being fired,
   wherein said plurality of insulating layers is made of a glass-ceramic material fired at a temperature lower than a temperature for firing the superconductive interconnection layers;
   superconductive ceramic material filling said holes of said insulating layers and electrically connecting said interconnection layers; and
   a metal layer encapsulating the interconnection layers of the superconductive ceramic material, the metal of the metal layer being selected from the group of gold, silver, platinum and an alloy thereof.

2. A multi-layer substrate according to claim 1, wherein the glass-ceramic material comprises 20 to 50% by weight of alumina, 10 to 60% by weight of quartz glass, and 20 to 40% by weight of one of glass and crystallized glass, said glass ceramic material being fired at a temperature lower than 1000° C.

3. A multi-layer substrate according to claim 1, wherein the glass-ceramic material comprises 20 to 50% by weight of alumina, 10 to 60% by weight of quartz glass, and 20 to 40% by weight of one of glass and crystallized glass, said glass-ceramic material being fired at a temperature lower than 900° C.

4. A multi-layer substrate according to claim 1, wherein each interconnection layer has a thickness of more than 20 μm.

* * * * *